(12) United States Patent
Torres et al.

(10) Patent No.: US 8,228,108 B2
(45) Date of Patent: Jul. 24, 2012

(54) HIGH SPEED FULLY DIFFERENTIAL RESISTOR-BASED LEVEL FORMATTER

(75) Inventors: Hector Torres, McKinney, TX (US); Charles Parkhurst, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 2 days.

(21) Appl. No.: 12/898,020

(22) Filed: Oct. 5, 2010

(65) Prior Publication Data
US 2011/0095798 A1   Apr. 28, 2011

Related U.S. Application Data

(60) Provisional application No. 61/254,099, filed on Oct. 22, 2009.

(51) Int. Cl.
*H03K 17/16* (2006.01)
*H03K 19/0175* (2006.01)
*G05F 1/10* (2006.01)

(52) U.S. Cl. ........ 327/307; 327/178; 327/538; 330/258; 330/259; 330/260

(58) Field of Classification Search .................. None
See application file for complete search history.

(56) References Cited

U.S. PATENT DOCUMENTS

| | | | |
|---|---|---|---|
| 6,111,431 A * | 8/2000 | Estrada | 326/83 |
| 6,356,141 B1 * | 3/2002 | Yamauchi | 327/543 |
| 6,603,348 B1 * | 8/2003 | Preuss et al. | 327/563 |
| 7,012,450 B1 * | 3/2006 | Oner et al. | 326/86 |
| 7,248,079 B2 * | 7/2007 | Bhattacharya et al. | 326/83 |
| 2009/0261872 A1 | 10/2009 | Coyne et al. | |

* cited by examiner

*Primary Examiner* — Lincoln Donovan
*Assistant Examiner* — Terry L Englund
(74) *Attorney, Agent, or Firm* — Steven A. Shaw; W. James Brady; Frederick J. Telecky, Jr.

(57) ABSTRACT

A level formatter is provided that has differentially coupled closed loop current sources, each configured to precisely establish a current proportional to a reference voltage. A bridge circuit is differentially coupled to two supplementary current sources and controlled to rapidly switch the current from the supplementary current sources to produce output voltages at respective outputs that are approximately equal to respective one of two reference voltages.

16 Claims, 6 Drawing Sheets

HIGH SPEED FULLY DIFFERENTIAL RESISTOR-BASED LEVEL FORMATTER

CROSS-REFERENCE TO RELATED APPLICATIONS

This application claims benefit of U.S. Provisional Patent Application Ser. No. 61/254,099, filed Oct. 22, 2009, which is incorporated herein by reference in its entirety.

BACKGROUND OF THE INVENTION

The automated test equipment (ATE) industry requires challenging analog circuit components to meet the performance requirements of their systems. The bench instrumentation industry also has similar requirements. In general, ATE makes extensive use of high speed differential drivers to drive the device under test (DUT). A pre-driver, i.e., a level formatter circuit, is a key component coupled to a driver in each the transmit data paths, i.e., channels, that drive the DUT. A level formatter is an analog multiplexer that selects between two user programmable voltages (e.g., VIH, VIL) in accordance with its control logic to determine which of the voltages is to be applied to the driver. These voltages vary in range and value, i.e., the voltages are not fixed.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
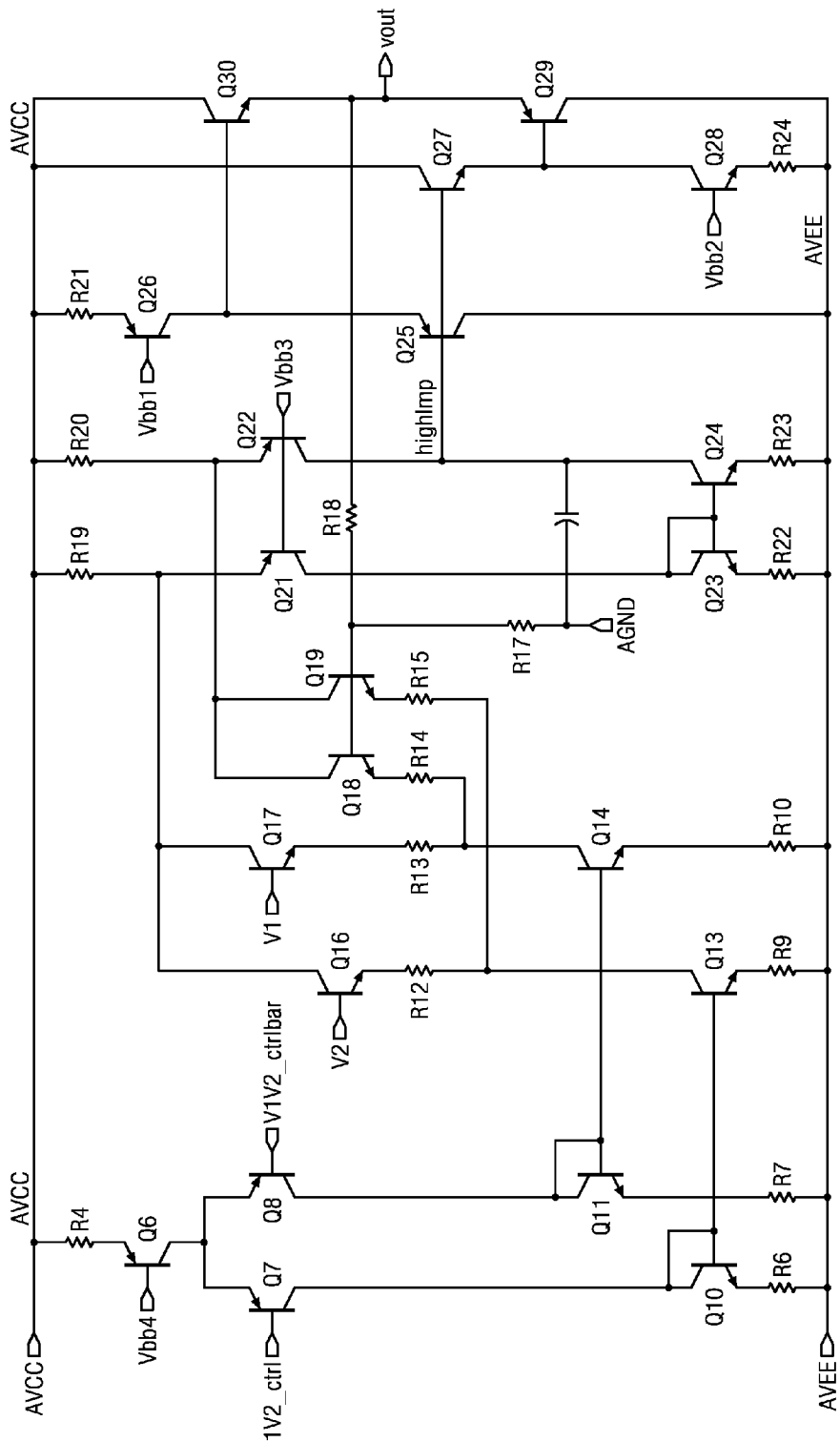
FIGS. 1 and 2 show schematic diagrams of prior art level formatters.

Specific embodiments of the invention will now be described in detail with reference to the accompanying figures. Like elements in the various figures are denoted by like reference numerals for consistency.

Certain terms are used throughout the following description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. In addition, although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

Figure 2:
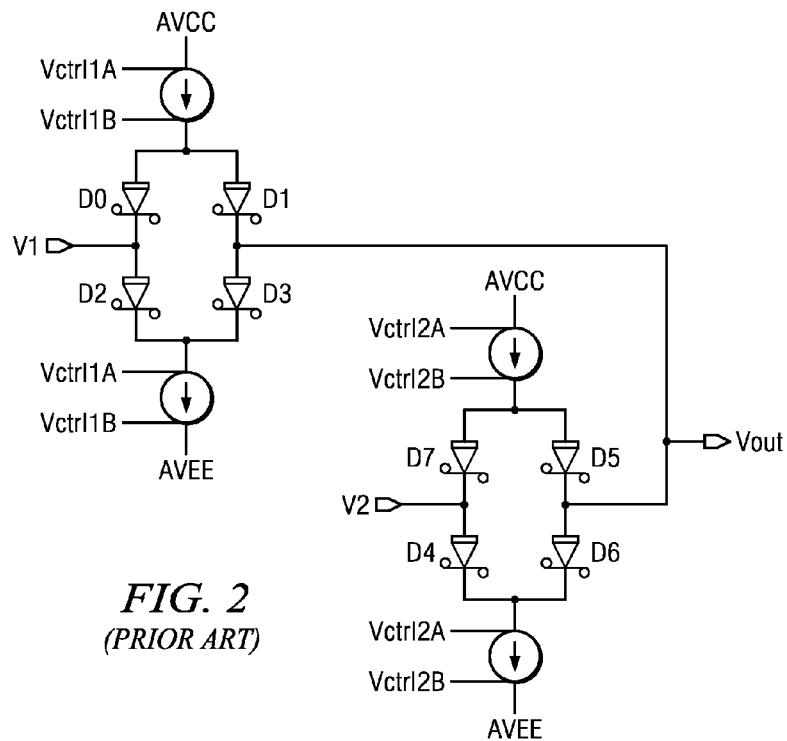

In general, embodiments of the invention provide for a programmable level formatter based on bipolar transistors with DC precision comparable to that of a prior art closed loop formatter and speed comparable to that of a prior art open-loop formatter. That is, prior art level formatters may include open-loop formatters using unguarded shottky diode bridges, a simplified example of which is shown in FIG. 1, or closed-loop formatters, a simplified example of which is shown in FIG. 2. The open-loop formatter is high speed but may be undesirable when stringent DC precision is needed as the shottky diode leakage variation with temperature may have a profound impact on DC accuracy. The closed-loop formatter provides high precision but may have speed limitations, especially as compared to open-loop formatters. Further, some prior art formatters used CMOS transmission gates, which are slower than bipolar transistors. Embodiments of the invention provide both speed and precision.

More specifically, in one or more embodiments of the invention, a level formatter is provided that switches reference voltages between two voltage output buffers based on differential voltage control signals. The switching is performed by a bipolar transistor bridge coupled to the voltage output buffers and arranged to receive currents from two current sources that are directly proportional to the references voltages. The bipolar bridge includes source and sink bipolar transistors arranged to perform steering of the two currents responsive to the differential control signals and biasing elements (e.g., resistors) arranged to bias the source bipolar transistors to replicate one reference voltage and the sink bipolar transistors to replicate the other reference voltage. In one embodiment, a source bipolar transistor is a PNP transistor and a sink bipolar transistor is an NPN transistor. The biasing elements are referenced to a common mode voltage that may be generated based on the two input reference voltages. The level formatter also includes a closed loop current source at each of the voltage inputs. The closed loop current sources are arranged to adjust the current levels produced by current sources coupled to the bipolar transistor bridge to be directly proportional to the input reference voltage received by the current control loop.

Figure 3:
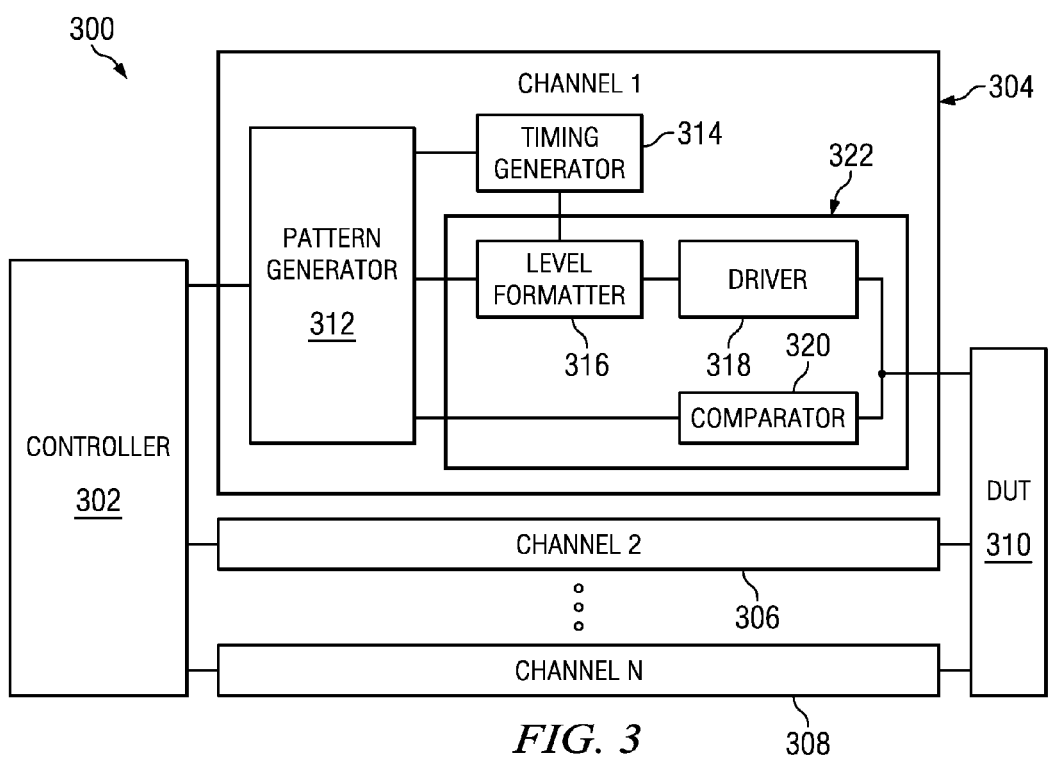
FIG. 3 shows a block diagram of an automated test equipment system in accordance with one or more embodiments of the invention.

FIG. 3 shows a block diagram of an automated test equipment (ATE) system (300) in accordance with one or more embodiments of the invention. The ATE system (300) is configured to detect errors in the operation of a device under test (DUT) (310) by applying stimulus signals to the DUT (310) and measuring response signals. The ATE system (300) includes multiple channels, channel 1 (304) to channel N (308), each connected to one test point on the DUT (310), and a controller (302) connected to the channels.

The controller (302) provides functionality to control the operation of the channels, channel 1 (304) to channel N (308), as well as an operator interface to allow a user to create and modify test programs to test the DUT (310). The controller (302) may include a computer workstation that provides the operator interface and the operational control of the channels. The controller (302) may also include a tester body that provides common resources used by the multiple channels.

The channels, channel 1 (304) to channel N (308), include circuitry that can, in any cycle, either generate a digital value to be applied to DUT (310) or measure a digital value received from the DUT (310). Referring to channel 1 (304) as representative of the multiple channels, channel 1 (304) includes a pattern generator (312), a timing generator (314), and pin electronics (322). The pattern generator (312) is programmable to specify what circuitry in channel 1 (304) should do during each test cycle. For example, the pattern generator (312) may specify a value to drive to the DUT (310) or a value expected from the DUT (310). More specifically, the pattern generator (312) stores a pattern that defines data to be applied or to be expected by the pin electronics (322) during each test cycle. The pattern also specifies the data value, e.g., logic 1 or logic 0, to be driven or to be expected.

The timing generator (314) generates timing signals to control the times at which signal transitions occur in the pin electronics (322), i.e., the times at which stimulus signals are applied to the DUT (310) or the times at which response from the DUT (310) are measured. For example, the timing generator (314) may generate a timing signal to specify the beginning of a signal being generated or the time at which a received value is compared to an expected value.

The pin electronics (322) include circuitry to drive a line connected to the DUT (310) and circuitry to measure a signal value received from the DUT (310) via the line. The pin electronics (322) include a level formatter (316), a driver (318), and a comparator (320). The level formatter (316), which is a level formatter in accordance with an embodiment of the invention, is clocked by the timing generator (314) and receives a data input from the pattern generator (312). The level formatter (316) generates signals corresponding to the value specified by the pattern generator (312). The driver (318) drives the signals from the level formatter (316) to the DUT (310).

In essence, the level formatter (316) formats the test signal to be driven to the DUT (310). The level formatter (316) may be designed to accommodate the use of the ATE system (300) with a variety of DUTs, by representing logic 1's or 0's in different formats. That is, the level formatter (316) may respond to format data from the pattern generator (312) that specifies how values are to be driven to a DUT. For example, some devices may represent a logic 1 by having a signal line at a high voltage during a test cycle. Other devices may represent a logic 1 by changing the state of the voltage at any point during a test cycle. Other devices may represent a logic 1 by a voltage pulse during the test cycle. In addition, various devices are designed to use different voltage levels for each logic value. For example, a CMOS device may represent a logic high as a voltage in the range of approximately 3.7-5.0 volts, while a low voltage device may represent a logic high as a voltage in the range of 2.0-3.6 volts. Similarly, different devices may represent a logic low with different ranges of voltages. The functionality of a level formatter (316) in accordance with one or more embodiments of the invention is described below in reference to FIG. 4.

The comparator (320) receives a value from the DUT (310) and a reference data input with the expected value from the pattern generator (312). The comparator (320) compares the two values and provides the result to the pattern generator (312). Although not specifically shown in FIG. 3, the timing generator (314) may control the timing of the comparator (320) operation.

Figure 4:
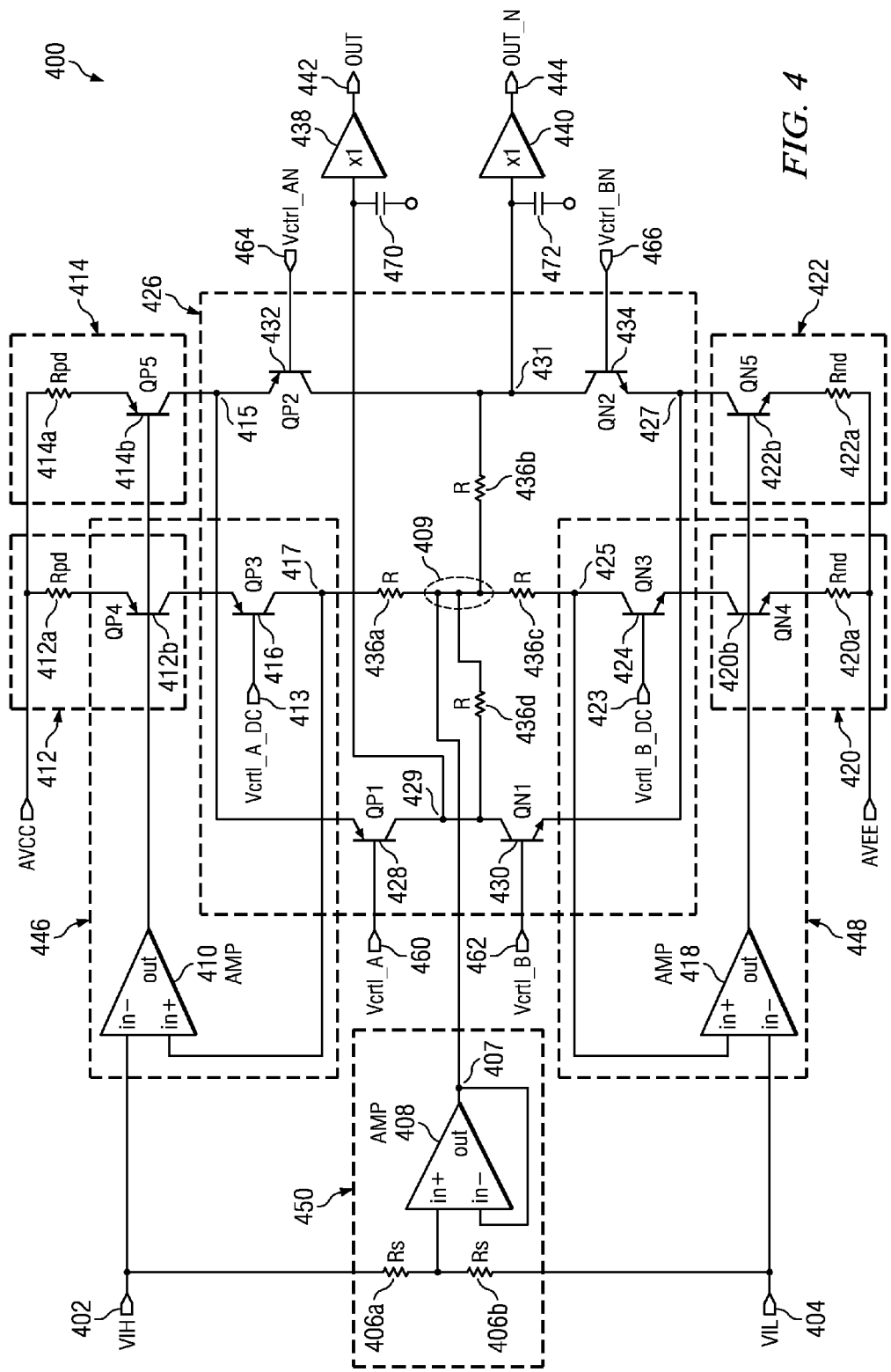
FIG. 4 shows a schematic diagram of a level formatter in accordance with one or more embodiments of the invention.

FIG. 4 shows a schematic diagram of a level formatter (400) (e.g., the level formatter (316) of FIG. 3) in accordance with one or more embodiments of the invention. In general, the level formatter (400) receives two reference voltages VIH and VIL and switches VIH and VIL between two output buffers (438, 440) with a bipolar transistor bridge (426) controlled by two differential control signal pairs, Vctrl_A, Vctrl_AN, and Vctrl_B, Vctrl_BN. The two reference voltages VIH and VIL are not fixed; that is, each voltage may vary in range and value, depending on the type of device under test and may also be varied by the tester to perform margin testing. More specifically, the level formatter (400) includes a VIH current control loop (446) coupled to a VIH voltage input (402), a VIL current control loop (448) coupled to a VIL voltage input (404), a bipolar transistor bridge (426), two supplementary current sources (414, 422) coupled between the current control loops (446, 448) and the bipolar transistor bridge (426), a common mode voltage generator (450) coupled to two resistors (e.g., biasing elements) (436b, 436d) in the bipolar transistor bridge (426); and two resistors (e.g., biasing elements) (436a, 436c) in the current control loops (446, 448), and two output buffers (438, 440) coupled to the bipolar transistor bridge (426) and to respective voltage outputs (442, 444).

The VIH current control loop (446) adjusts the current provided by the current source (412) such that the current at an output node (417) is directly proportional to the input voltage VIH received at the VIH voltage input (402). That is, as the input voltage VIH changes (rises or falls), the VIH current control loop (446) changes the current (increases or decreases) to be directly proportional to the changed input voltage VIH. This has the effect of replicating VIH at the output node (417), i.e., of maintaining a voltage approximately equal to VIH at the output node (417). Together, the VIH current control loop (446) and the current source (412) form a VIH closed loop current source. The current resulting from this closed loop current source is mirrored at the supplementary VIH current source (414). Thus, the current at an output node (415) of the supplementary VIH current source (414), i.e., the current provided to the bipolar transistor bridge (426) by the VIH current source (414), is directly proportional to the input voltage VIH. This has the effect of replicating VIH at an output node in the bipolar transistor bridge (426), i.e., the output node (431) or the output node (429), when the current is steered to the output node.

More specifically, the VIH current control loop (446) includes an op amp (410), a current source (412), and a bipolar transistor QP3 (416) coupled at its base to a current control input (413) for the current control signal Vctrl_A_DC. The bipolar transistor QP3 (416) is included in the VIH current control loop (446) to account for the voltage drop across the source bipolar transistors QP1 and QP2 (428, 432) coupled to voltage control signals in the bipolar transistor bridge (426). Thus, the current control signal Vctrl_A_DC is set to the low level of the voltage control signal Vctrl_A. The current source (412) provides a current level through resistor 436a that is determined by the VIH reference voltage and a common mode voltage from the common mode voltage node (409), as controlled by op amp (410). The current source (412) is formed by a bipolar transistor QP4 (412b) and a resistor Rpd (412a) and the mirroring VIH current source (414) is formed by a bipolar transistor QP5 (414b) and a resistor Rpd (414a). The voltage from the op amp (410) is determined by the VIH voltage (i.e., a reference voltage) received at the negative terminal of the op amp (410) and the voltage from the output node (417) received at the positive terminal of the op amp (410). The voltage from the output node (417) is determined by the current from the current source (412) multiplied by the resistance of the resistor R (436a).

The VIL current control loop (448) adjusts the current provided by the current source (420) such that the current at an output node (425) is directly proportional to the input voltage VIL received at the VIL voltage input (404). That is, as the input voltage VIL changes (rises or falls), the VIL current control loop (448) changes the current (increases or decreases) to be directly proportional to the changed input voltage VIL. This has the effect of replicating VIL at the output node (425), i.e., of maintaining a voltage approximately identical to VIL at the node (425). Together, the VIL current control loop (448) and the current source (420) form a VIL closed loop current source that is differentially coupled to the VIH closed loop current source. The current resulting from the VIL closed loop current source is mirrored at the supplementary VIL current source (422). Thus, the current at an output node (427) of the supplementary VIL current source (422), i.e., the current provided to the bipolar transistor bridge (426) by the VIL current source (422), is directly proportional to the input voltage VIL. This has the effect of replicating VIL at an output node in the bipolar transistor bridge (426), i.e., the output node (431) or the output node (429), when the current is steered to the output node.

More specifically, the VIL current control loop (448) includes an op amp (418), a current source (420), and a bipolar transistor QN3 (424) coupled at its base to a current control input (423) for the current control signal Vctrl_B_DC. The bipolar transistor QN3 (424) is included in the VIL current control loop (448) to account for the voltage drop across the sink bipolar transistors QN1 and QN2 (430, 434) coupled to voltage control signals in the bipolar transistor bridge (426). Thus, the current control signal Vctrl_B_DC is set to the high level of the voltage control signal Vctrl_B. The current source (420) provides a current level through resistor R (436c) that is determined by the VIL reference voltage and the common mode voltage from the common mode voltage node (409), as controlled by op amp (418). The current source (420) is formed by a bipolar transistor QN4 (420b) and a resistor Rnd (420a) and the mirroring VIL current source (422) is formed by a bipolar transistor QN5 (422b) and a resistor Rnd (422a). The voltage from the op amp (418) is determined by the VIL voltage (i.e., a reference voltage) received at the negative terminal of the op amp (418) and the voltage from the output node (425) received at the positive terminal of the op amp (418). The voltage from the output node (425) is determined by the current from the current source (420) multiplied by the resistance of the resistor R (436c).

The common mode voltage generator (450) provides a common mode voltage level at the common mode voltage node (409) as a reference for resistor R (436a), resistor R (436b), resistor R (436c), and resistor R (436d). These four resistors (436a-d) are star-connected to the common mode voltage node (409). The common mode voltage generator (450) includes resistor Rs (406a) coupled to the VIH voltage input (402), resistor Rs (406b) coupled to the VIL voltage input (404), and an op amp (408). The common mode voltage level from the op amp (408) is determined a voltage based on the VIH voltage and the VIL voltage (i.e., reference voltages) as received at the positive terminal of the op amp (418) and the voltage from an output node (407). Typically, the value of resistor Rs (406a) and resistor Rs (406b) will be the same, which causes the common mode voltage node (409) to be held at a voltage level that is midway between the VIH voltage and the VIL voltage.

The bipolar transistor bridge (426) is differentially coupled to the supplementary current sources. The left side of the bipolar transistor bridge (426) includes a source bipolar transistor QP1 (428) coupled at its base to a voltage control input (460) for a voltage control signal Vctrl_A and a sink bipolar transistor QN1 (430) coupled at its base to a voltage control input (462) for a voltage control signal Vctrl_B. The two bipolar transistors (428, 430) are also coupled to a resistor R (436d) that biases the source bipolar transistor QP1 (428) to replicate VIH at a left output node (429) when the voltage control signal Vctrl_A is asserted, and the sink bipolar transistor QN1 (430) to replicate VIL at the left output node (429) when the voltage control signal Vctrl_B is asserted. The output buffer (438) is coupled to the left output node (429) to receive the voltage at the left output node (429).

The right side of the bipolar transistor bridge (426) includes a source bipolar transistor QP2 (432) coupled at its base to a voltage control input (464) for a voltage control signal Vctrl_AN and a sink bipolar transistor QN2 (434) coupled at its base to a voltage control input (466) for a voltage control signal Vctrl_BN. The two bipolar transistors (432, 434) are also coupled to resistor R (436b) that biases the source bipolar transistor QP2 (432) to replicate VIH at the right output node (431) when the voltage control signal Vctrl_AN is asserted, and the sink bipolar transistor QN2 (434) to replicate VIL at the right output node (431) when the voltage control signal Vctrl_BN is asserted. The output buffer (440) is coupled to the right output node (431) to receive the voltage at the right output node (431). The resistors R (436b, 436d) are referenced to the common voltage, i.e., are coupled to the common mode voltage node (409). Voltage control signals Vctrl_A and Vctrl_AN are a differential signal pair and voltage control signals Vctrl_B and Vctrl_BN are a differential signal pair. The voltage control signals may be provided by a pattern generator, e.g., the pattern generator (312) of FIG. 3.

The current from the supplementary VIH current source (414) is steered to the left or right of the bipolar transistor bridge (426) based on the differential control signal pair Vctrl_A, Vctrl_AN and the current from the supplementary VIL current source (422) is steered to the left or right of the bipolar transistor bridge (426) based on the differential control signal pair Vctrl_B, Vctrl_BN. More specifically, the bipolar transistor bridge (426) operates as follows. If Vctrl_A>Vctrl_AN, then the current from the VIH current source (414) is steered to the right side of the bipolar transistor bridge (426), and VIH is replicated at the right output node (431). If Vctrl_A414) is steered to the left side of the bipolar transistor bridge (426), and VIH is replicated at the left output node (429). If Vctrl B>Vctrl BN, then the current from the VIL current source (422) is steered to the left side of the bipolar transistor bridge (426), and VIL is replicated at the left output node (429). If Vctrl B<Vctrl BN, then the current from the VIL current source (422) is steered to the right side of the bipolar transistor bridge (426), and VIL is replicated at the right output node (431). Thus, if Vctrl_A>Vctrl_AN and Vctrl_B>Vctrl_BN, then VIL is provided at the voltage output (442) and VIH is provided at the voltage output (444). And, if Vctrl_A442) and VIL is provided at the voltage output (444).

Parasitic capacitance (470, 472) associated with the output buffers (438, 440) affects rise time and slew rate of the voltages developed at the output bridge nodes (429, 431) which in turn determines the rise time and slew rates of the output signals from output buffers (438, 440). The rise and fall times are set by the current provided by the supplementary current sources to charge the parasitic capacitance at the inputs of the output buffers. By balancing the bridge around common mode node 409 and setting the impedance values of all four star connected resistors (436*a-d*) to be the same, the rise time and slew rates at both bridge output nodes (429, 431) are controlled to be approximately equal.

Note that in FIG. 4 the resistors R (436*a-d*) that directly or indirectly bias some of the bipolar transistors to replicate VIH or VIL are star-connected to the common mode voltage node (409). In other embodiments of the invention, the resistors may be connected to a common mode voltage source, e.g., the common mode voltage generator (450), in any suitable way. In some embodiments of the invention, the bipolar transistors QP1, QP2, and QP3 have the same area as do the bipolar transistors QP4 and QP5. Further, the bipolar transistors QN1, QN2, and QN3 have the same area as do the bipolar transistors QN4 and QN5.

The symmetric sourcing and sinking of the bipolar transistor bridge balanced around the common mode voltage in embodiments of the invention achieves a symmetric rise/fall waveform that provides precision in the voltages produced at the output buffers.

Figure 5:
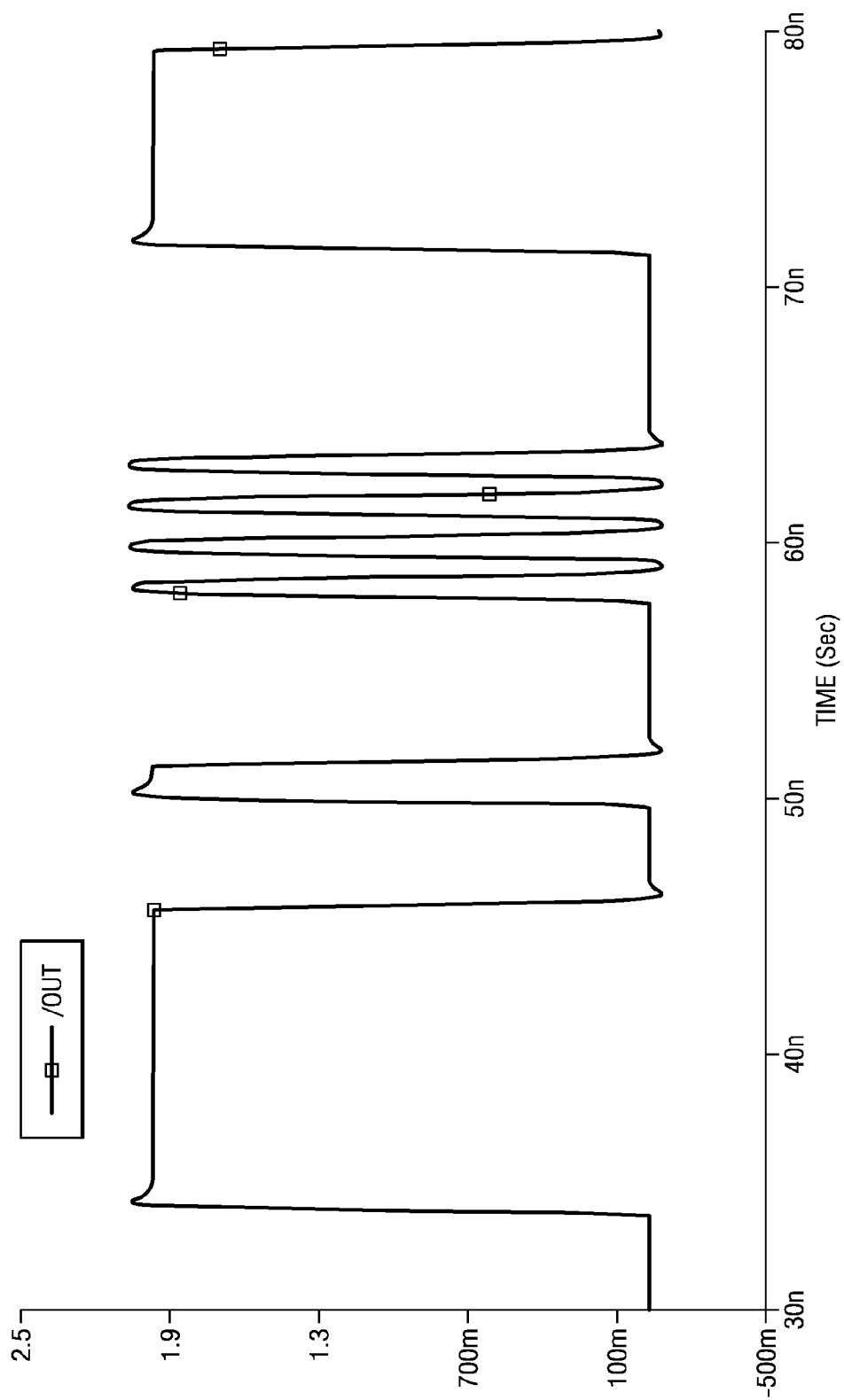
FIGS. 5 and 6 show graphs of simulation results in accordance with one or more embodiments of the invention.
Figure 6:
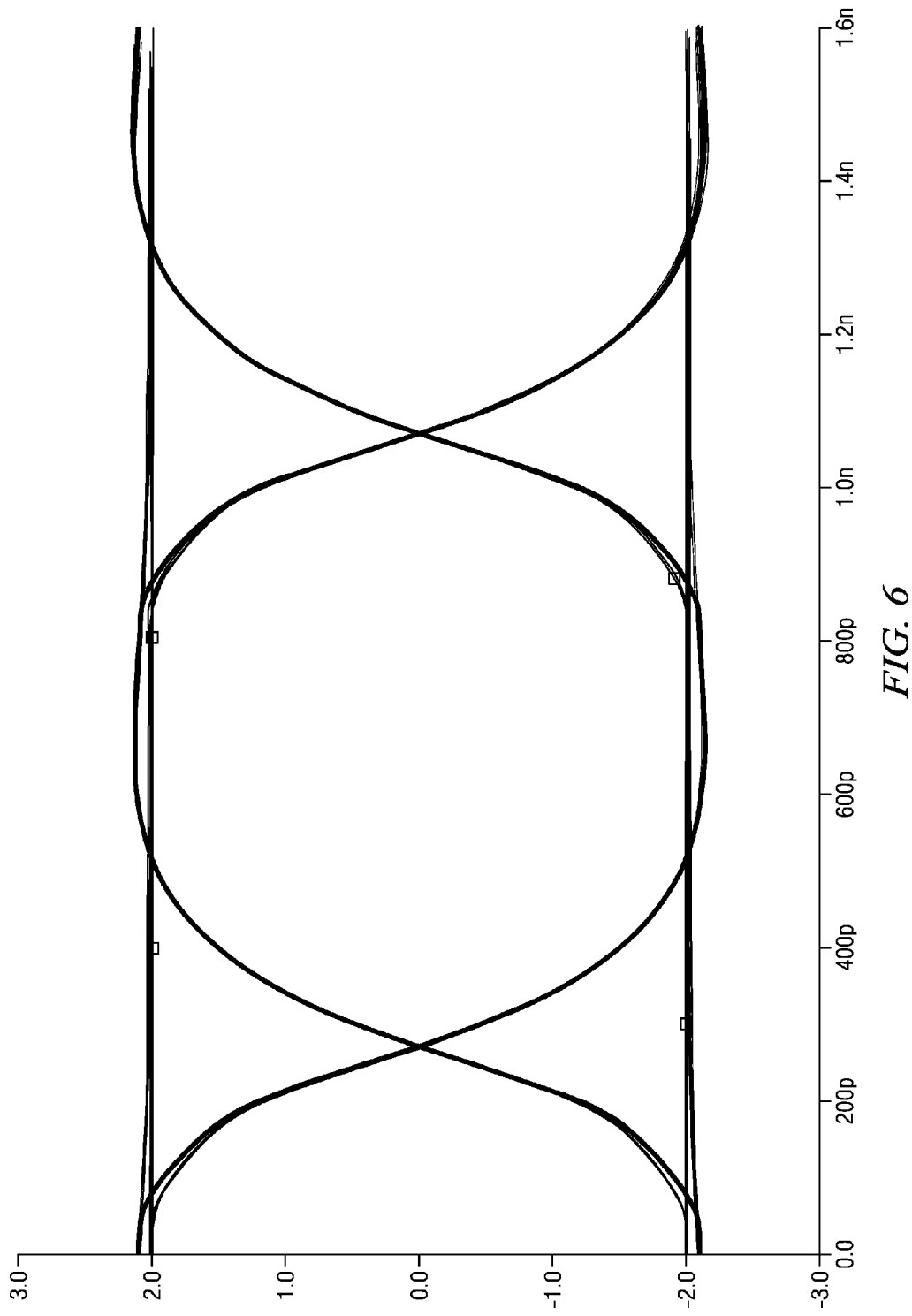

The design of FIG. 4 was simulated as a 5 GHz complementary bipolar process. FIG. 5 and FIG. 6 show graphs of the simulation results. The graph of FIG. 5 shows the output voltage Out (see FIG. 4) over time and FIG. 6 shows an eye diagram of the transient response of the output voltage Out and the output voltage Out_N. Note that the simulated design produced rise/fall times on the order of 140 psec for two volt swings.

Careful design is required for the control signals to achieve the DC and AC timing needed. The programmable levels for the VIH and VIL reference voltages are achieved by means of digital to analog (DACs) driving the VIH/VIL levels as determined by the controller (302) of the ATE system.

Figure 7:
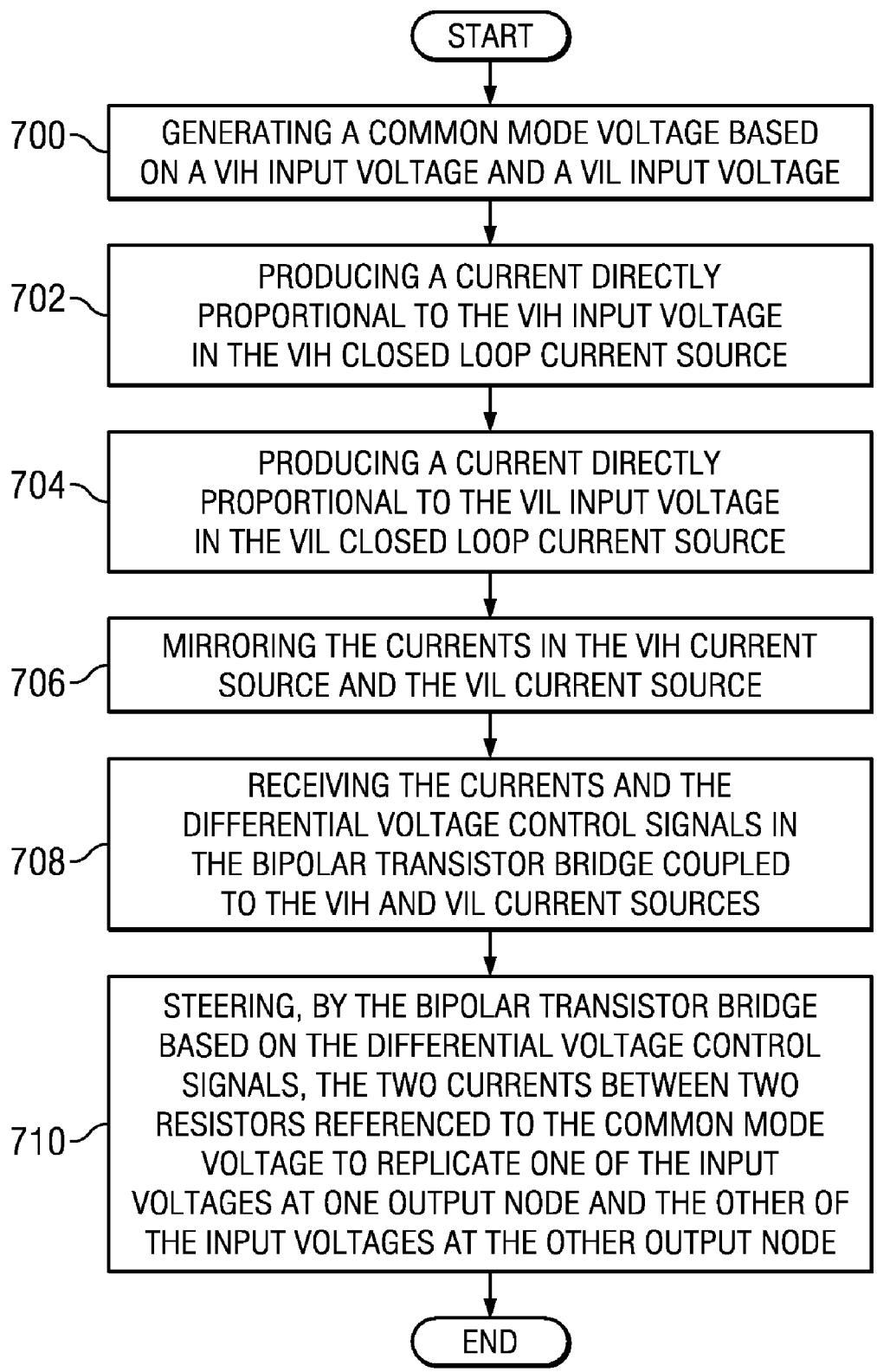
FIG. 7 shows a flow diagram of a method in accordance with one or more embodiments of the invention.

FIG. 7 shows a flow diagram of a method of operation of the level formatter of FIG. 4 in accordance with one or more embodiments of the invention. A common mode voltage is generated (700) based on a VIH input voltage and a VIL input voltage received at inputs to the level formatter. This common mode voltage is generated by the common mode voltage generator (450) coupled to the input voltages and the common mode voltage generator (450) may hold the common mode voltage at a level midway between the two input voltages.

A current directly proportional to the VIH input voltage is produced (702) in a VIH closed loop current source and a current directly proportional to the VIL input voltage is produced (704) in a VIL closed loop current source. Each of these closed loop current sources produces its current through a resistor (436*a*, 436*c*) referenced to the common mode voltage. Further, the current produced by the VIH closed loop current source is mirrored in the supplementary VIH current source (414) coupled to the bipolar transistor bridge (426), and the current produced by the VIL closed loop current source is mirrored (706) in the supplementary VIL current source (422) coupled to the bipolar transistor bridge.

The currents from the supplementary VIH and VIL current sources (414, 422) are received (708) in the bipolar transistor bridge (426) along with the differential voltage control signals. The bipolar transistor bridge (426) steers (710) the received currents between two resistors (436*b*, 436*d*) in accordance with the differential voltage control signals to replicate one of the input voltages at one output node of the bipolar transistor bridge and the other input voltage at the other output node. These two resistors are also referenced to the common mode voltage. The current steering based on the values of the differential voltage control signals is described above in reference to FIG. 4.

While the invention has been described with respect to a limited number of embodiments, those skilled in the art, having benefit of this disclosure, will appreciate that other embodiments can be devised which do not depart from the scope of the invention as disclosed herein. For example, instead of two pairs of control signals (Vctrl_A, Vctrl_B), another embodiment may use a single control signal that is split and buffered to control the bipolar transistor bridge.

While resistors are described herein, other types of impedance devices may be used, for example MOS devices when supported by the circuit process, discrete devices, bulk semiconductor devices, surface effect devices, etc.

In another embodiment, the bridge may be implemented with other types of semiconductor devices. For example, metal oxide semiconductors (MOS) or complimentary MOS (CMOS) devices now known or later developed that have sufficient switching time may be used. In another embodiment, PNP devices may be used in place of NPN devices and vice versa, by configuring the control circuitry appropriately.

Accordingly, the scope of the invention should be limited only by the attached claims. It is therefore contemplated that the appended claims will cover any such modifications of the embodiments as fall within the true scope and spirit of the invention.

What is claimed is:

1. A level formatter comprising:
a common mode voltage generator with inputs coupled to two reference voltages and an output coupled to a common mode voltage node;
two differentially coupled closed loop current sources, each having an input to receive a respective one of the two reference voltages and an output coupled to the common mode voltage node via a respective bias element having an impedance value, wherein each closed loop current source is configured to produce a current through the respective bias element that is directly proportional to the respective reference voltage; and
a bipolar transistor bridge differentially coupled to two supplementary current sources, wherein each supplementary current source produces a respective current equal to a respective one of the closed loop current sources, wherein the bipolar transistor bridge is configured to steer the respective currents between two additional bias elements each coupled to the common mode voltage node and each having an impedance value, wherein respective output voltages are produced at respective outputs that are approximately equal to respective ones of the two reference voltages.

2. The level formatter of claim 1, further comprising:
a first voltage output buffer coupled to receive one of the output voltages; and
a second voltage output buffer coupled to receive the other output voltage.

3. The level formatter of claim 1, wherein the bias elements in the closed loop current sources and the additional bias elements in the bipolar transistor bridge have a same impedance value, whereby operation of the bipolar transistor bridge is balanced around a common mode voltage.

4. The level formatter of claim 1, wherein the closed loop current sources are configured to produce respective currents that remain directly proportional to the respective reference voltages when the respective reference voltages are varied over a range of values.

5. The level formatter of claim 1, wherein the supplementary current sources are each coupled to a respective one of the closed loop current sources and are configured to mirror the current produced by the respective closed loop current source.

6. The level formatter of claim 1, wherein the bipolar transistor bridge comprises two legs coupled between the two supplementary current sources, each leg having a source bipolar transistor and a sink bipolar transistor with a respective one of the additional two bias elements connected to a node between the source bipolar transistor and the sink bipolar transistor, wherein a base of each source bipolar transistor is coupled to a respective one of a first control signal differential pair, and wherein a base of each sink bipolar transistor is coupled to a respective one of a second control signal differential pair.

7. A method comprising:
providing, by a first closed loop current source, a first current to a bipolar transistor bridge, wherein the first current is directly proportional to a first voltage, wherein the first current is produced through a bias element referenced to a common mode voltage and having an impedance value;
providing, by a second closed loop current source, a second current to the bipolar transistor bridge, wherein the second current is directly proportional to a second voltage, wherein the second current is produced through another bias element referenced to the common mode voltage and having an impedance value; and
steering, by the bipolar transistor bridge responsive to at least one differential control signal, the first current and the second current between an additional two bias elements referenced to the common mode voltage and having an impedance value, wherein one of the first and second voltages is replicated at a first output of the bipolar transistor bridge and the other of the first and second voltages is replicated at a second output of the bipolar transistor bridge.

8. The method of claim 7, further comprising:
mirroring the first current in a first current source coupled between the first closed loop current source and the bipolar transistor bridge; and
mirroring the second current in a second current source coupled between the second closed loop current source and the bipolar transistor bridge.

9. The method of claim 7, wherein the steering further comprises:
the at least one differential voltage control signal comprises a first differential signal pair and a second differential signal pair; and
wherein the steering further comprises:
steering the first current to a first leg of the bipolar transistor bridge when a signal in the first differential signal pair is less than a complementary signal in the first differential signal pair, the first leg comprising the first output; and
steering the second current to a second leg of the bipolar transistor bridge when a signal in the second differential signal pair is less than a complementary signal in the second differential signal pair, the second leg comprising the second output,
wherein the first voltage is replicated at the first output and the second voltage is replicated at the second output.

10. The method of claim 9, wherein the steering further comprises:
steering the first current to the second leg of the bipolar transistor bridge when the signal in the first differential pair is greater than the complementary signal in the first differential pair; and
steering the second current to the first leg of the bipolar transistor bridge when the signal in the second differential pair is greater than the complementary signal in the second differential pair, wherein the first voltage is replicated at the second output and the second voltage is replicated at the first output.

11. An automatic test equipment (ATE) system comprising:
a controller;
a device under test (DUT); and
a channel connected between the controller and the DUT, the channel comprising a level formatter operable to provide voltages to be applied to the DUT, wherein the level formatter comprises:
a common mode voltage generator with inputs coupled to two reference voltages and an output coupled to a common mode voltage node;
two differentially coupled closed loop current sources, each having an input to receive a respective one of the two reference voltages and an output coupled to the common mode voltage node via a respective bias element having an impedance value, wherein each closed loop current source is configured to produce a current through the respective bias element that is directly proportional to the respective reference voltage; and
a bipolar transistor bridge differentially coupled to two supplementary current sources, wherein each supplementary current source produces a respective current equal to a respective one of the closed loop current sources, wherein the bipolar transistor bridge is configured to steer the respective currents between two additional respective bias elements each coupled to the common mode voltage node and each having an impedance value, wherein respective output voltages are produced at respective outputs that are approximately equal to respective ones of the two reference voltages.

12. The level formatter of claim 11, further comprising:
a first voltage output buffer coupled to receive one of the output voltages; and
a second voltage output buffer coupled to receive the other output voltage.

13. The level formatter of claim 11, wherein the bias elements in the closed loop current sources and the additional bias elements in the bipolar transistor bridge have a same impedance value, whereby operation of the bipolar transistor bridge is balanced around a common mode voltage.

14. The level formatter of claim 11, wherein the closed loop current sources are configured to produce respective currents that remain directly proportional to the respective reference voltages when the respective reference voltages are varied over a range of values.

15. The level formatter of claim 11, wherein the supplementary current sources are each coupled to a respective one of the closed loop current sources and are configured to mirror the current produced by the respective closed loop current source.

16. The level formatter of claim 11, wherein the bipolar transistor bridge comprises two legs coupled between the two supplementary current sources, each leg having a source bipolar transistor and a sink bipolar transistor with a respective one of the additional two bias elements connected to a node between the source bipolar transistor and the sink bipolar transistor, wherein a base of each source bipolar transistor is coupled to a respective one of a first control signal differential pair, and wherein a base of each sink bipolar transistor is coupled to a respective one of a second control signal differential pair.

\* \* \* \* \*